United States Patent [19]

Honma

[11] Patent Number: 5,406,527

[45] Date of Patent: Apr. 11, 1995

[54] PARTIAL WRITE TRANSFERABLE MULTIPORT MEMORY

[75] Inventor: Yasuaki Honma, Kawasaki, Japan

[73] Assignee: Kabushiki Kaisha Toshiba, Kawasaki, Japan

[21] Appl. No.: 81,175

[22] Filed: Jun. 25, 1993

[30] Foreign Application Priority Data

Jun. 26, 1992 [JP] Japan .................................. 4-169377

[51] Int. Cl.⁶ .............................................. G11C 8/00
[52] U.S. Cl. ............................... 365/230.05; 365/220; 365/221; 365/230.08; 365/230.09
[58] Field of Search ................... 365/220, 221, 230.05, 365/230.08, 230.09

[56] References Cited

U.S. PATENT DOCUMENTS 5,134,589  7/1992  Hamano ......................... 365/230.05
5,257,237 10/1993  Aranda et al. .................. 365/230.05
5,260,905 11/1993  Mori ............................... 365/230.05

Primary Examiner—Terrell W. Fears
Assistant Examiner—F. Niranjain
Attorney, Agent, or Firm—Foley & Lardner

[57] ABSTRACT

The dual port DRAM comprises a SAM section having a plurality of registers, for inputting and outputting data in series between a SAM input/output port and the outside in synchronism with a control signal; a RAM section having a plurality of memory cells, for inputting and outputting data at random between a RAM input-/output port and the outside; a plurality of transfer gates connected between the SAM section and the RAM section, for transferring data in parallel; and a selecting section for selectively turning on or off only the transfer gates connected to the registers in the SAM section to which data are inputted from the SAM input-/output port in series in synchronism with the control signal, to execute partial parallel-data transfer from the SAM section to the RAM section via the transfer gates. Therefore, in a dual port DRAM having both RAM and SAM sections, when data stored in partial areas of the RAM section are required to be rewritten, only data to be updated are transferred from the SAM section to the RAM section for partial data rewriting operation.

21 Claims, 4 Drawing Sheets

PARTIAL WRITE TRANSFERABLE MULTIPORT MEMORY

FIELD OF THE INVENTION

The present invention relates to a dual port DRAM having a RAM (random access memory) section and a SAM (serial access memory) section.

BACKGROUND OF THE INVENTION

FIG. 3 is a schematic diagram showing a conventional dual port DRAM. As shown in the drawing, a RAM section 1 for reading and writing data at random is connected to a SAM section 3 through transfer gates 2. A control signal CS is inputted to a control circuit 7. A transfer signal TS is inputted from the control circuit 7 to the transfer gates 2. In response to a signal S from the control circuit 7 and on the basis of an address A, an address select signal ASS for designating a row address to be accessed is given from an address decoder 7a to the RAM section 1. External input data ED inputted through a data buffer 5 is written in an area on the SAM section 3, which is designated by a serial address pointer 4. An address AD and an external clock SC are applied to a serial address decoder 6. The serial address decoder 6 decodes the applied address AD and gives a serial decoded address signal SAS to the serial address pointer 4 to acquire the external input data ED by the SAM section 3 in response to the external clock SC. Further, in response to the external clock SC, a counter of the SAM section 3 is incremented.

The operation of the conventional dual port DRAM will be described hereinbelow.

The external input data ED to be written in the RAM section 1 is given to the data buffer 5. This external input data ED is first stored in the SAM section 3. That is, on the basis of the address AD given to the address decoder 6, the serial address signal SAS is inputted to the serial address pointer 4 as a start address. Thereafter, in response to the external clock SC, the external input data ED is acquired by the SAM section 3 and further the counter of the SAM section 3 is incremented. Successively, on the basis of the transfer signal TS applied from the control circuit 7 to which the control signal CS is given, the transfer gates 2 are opened. Accordingly, all the data on the SAM section 3 are transferred in parallel to each other to a row address on the RAM section 1 designated by the address select signal ASS given by the address decoder 7a.

As described above, the conventional dual port DRAM is so configured that all the data of the SAM section 3 are transferred to a row address of the RAM section 1 together. Therefore, although data can be transferred in one input or output unit, it is impossible to transfer data partially. In more detail, as shown in FIG. 4, it is impossible to rewrite only data in the area B of a rewritable region 13 in one row region 14 in the RAM section 1. In other words, it is impossible to rewrite only the data in the area A of the SAM section 3 and further transfer the rewritten data to the RAM section 1 for a rewriting operation. If the data rewriting operation is executed, the data in the areas A1 and A2 other than the area A of the SAM section 3 are transferred to the row region 14 of the RAM section 1 through the transfer gates 2, with the result that the data (not required to be rewritten) in the areas C and D other than the area B are destroyed.

Consequently, in the conventional dual port DRAM, even when a partial area in a row of the RAM section 1 is required to be rewritten, after the data in all the areas A1, A and A2 of the SAM section 3 have been all once rewritten, the rewritten data must be transferred to the RAM section 1. Alternatively, after the data in a row address including an area required to be written have been all once transferred from the RAM section 1 to the SAM section 3, only data in the necessary area must be rewritten in the SAM section 3 and further must be returned to the RAM section 1.

To overcome the above-mentioned disadvantage, there has been so far known a block write function for each 4-cell unit or a flash write function for row unit. In these methods, however, there exists a problem in that the bits to be written are not redundant and therefore it is impossible to freely select the data areas.

In particular, in the case where multiple windows are displayed on a CRT display picture with the use of a semiconductor memory device, even when only one image is required to be written, it is necessary to check and further input data for the other images not required to be rewritten, with the result that a long data processing time is inevitably needed and therefore the display image cannot be switched smoothly under preferable conditions.

As described above, in the conventional semiconductor memory device, when a partial area of the RAM section is required to be rewritten, unnecessary processing cycles to be executed. Therefore, there exists problems in that a long processing time is required for a partial rewriting operation and further the peripheral circuits become complicated, as compared with the whole row data rewriting operation in the RAM section.

SUMMARY OF THE INVENTION

With these problem in mind, therefore, the object of the present invention is to provide a dual port DRAM comprising both RAM and SAM sections, by which when data stored in areas of the RAM section are required to be rewritten partially, only data to be updated are transferred from the SAM section to the RAM section for enabling a partial data rewriting operation.

To achieve the above-mentioned object, the dual port DRAM according to the present invention comprises: a RAM section for storing data each composed of a plurality of bits and for inputting and outputting data at random from and to the outside; a SAM section for storing data each composed of a plurality of bits and for inputting and outputting data in series from and to the outside; a transfer gate section connected between said RAM section and said SAM section and having a plurality of transfer gates, each of the transfer gates being provided in correspondence to each bit of said RAM section and said SAM section; and selecting means for selectively turning on one or plural transfer gates corresponding to one or plural bits rewritten in said SAM section, to execute parallel data transfer from said SAM section to said RAM section.

In the dual port DRAM of the present invention, data in the SAM section are transferred to the RAM section in parallel to rewrite data in the RAM section. In this process, the selecting means transfers data in the SAM section selectively in parallel, so that data in the RAM section can be rewritten partially. Namely, the selecting means selectively turns on only transfer gates connected to the SAM section registers to which data are inputted in series in synchronism with the control signal, from among a plurality of the transfer gates interposed between the SAM section and the RAM section. Therefore, data can be transferred in parallel from the SAM section to the RAM section to rewrite data of the RAM section partially.

DETAILED DESCRIPTION OF THE PREFERRED EMBODIMENTS

An embodiment of the present invention will be described hereinbelow with reference to the attached drawings.

Figure 1:
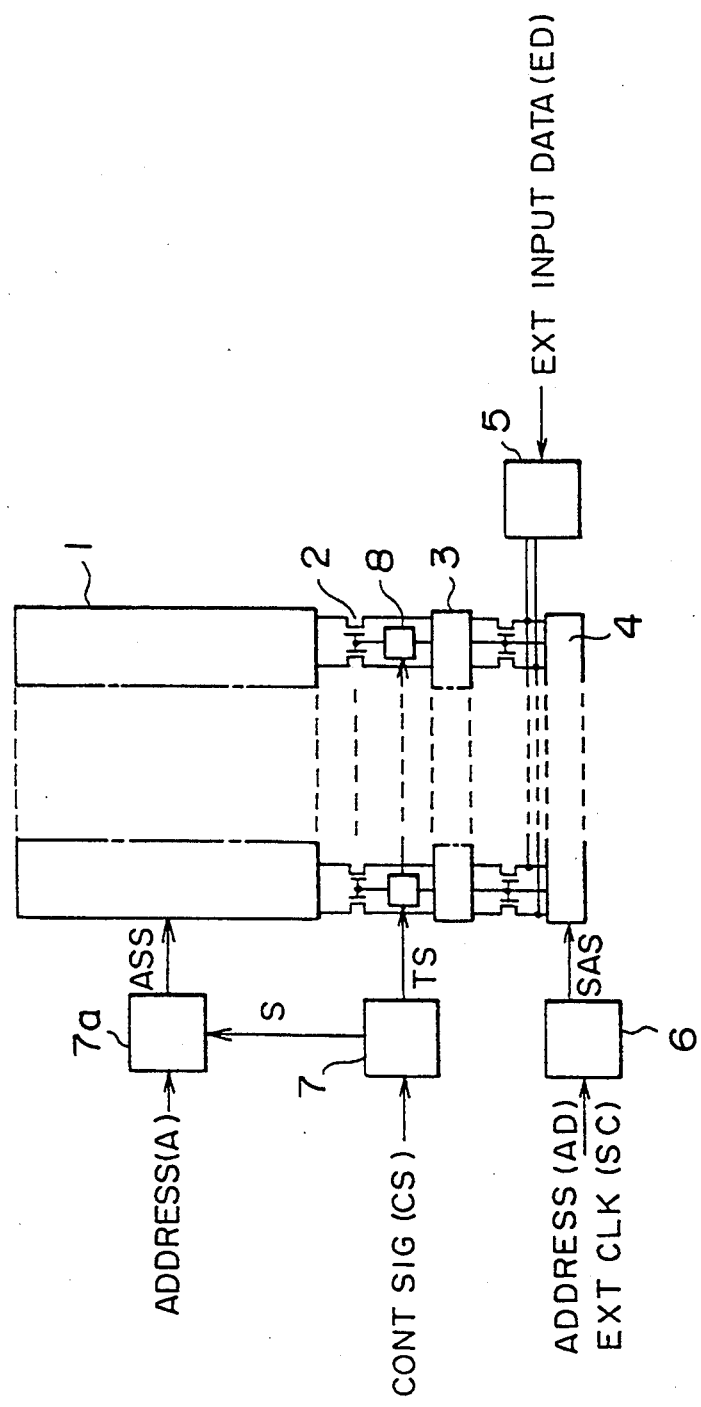
FIG. 1 is a schematic block diagram showing one embodiment of the dual port DRAM according to the present invention.
Figure 3:
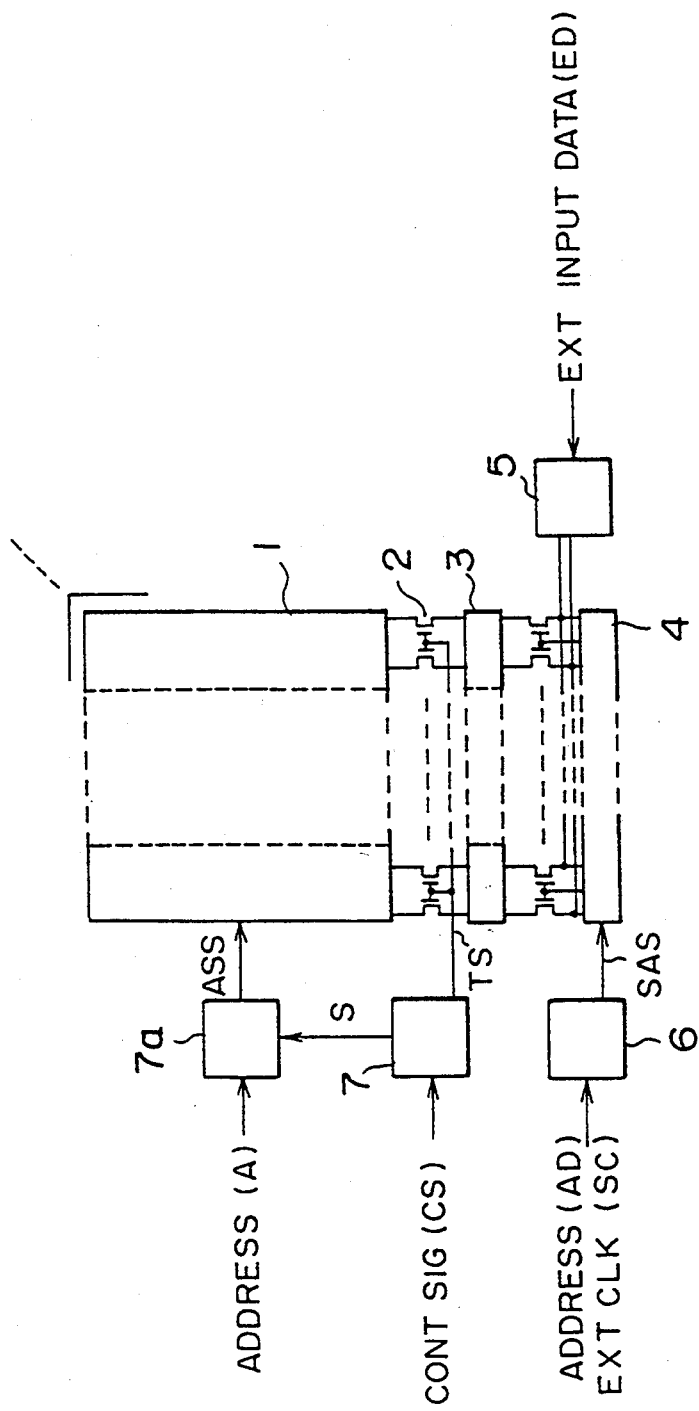
FIG. 3 is a schematic block diagram showing a conventional semiconductor memory device.
Figure 4:
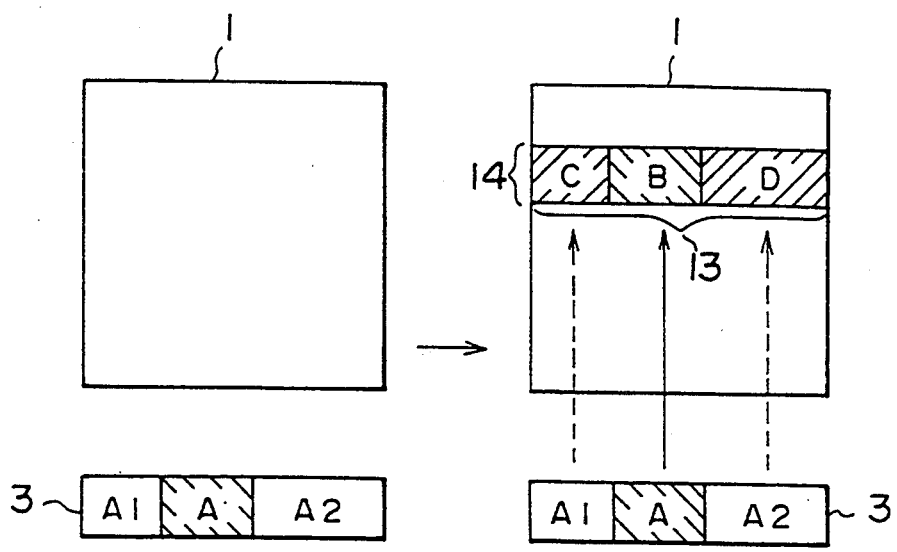
FIG. 4 is an illustration for assistance in explaining the data transfer for partial data rewriting operation in the conventional memory device shown in FIG. 3.

FIG. 1 is a schematic block diagram showing one embodiment of the present invention. In FIG. 1, the same reference numerals have been retained for similar parts or elements which have the same functions as with the case of the conventional dual port DRAM shown in FIG. 3. In FIG. 1, selecting circuits 8 are connected between the transfer gates 2 and the SAM section 3, respectively. The selecting circuits 8 transfer data stored only in the data areas designated by the serial address pointer 4 from the SAM section 3 to the RAM section 1 through the transfer gates 2, respectively.

Figure 2:
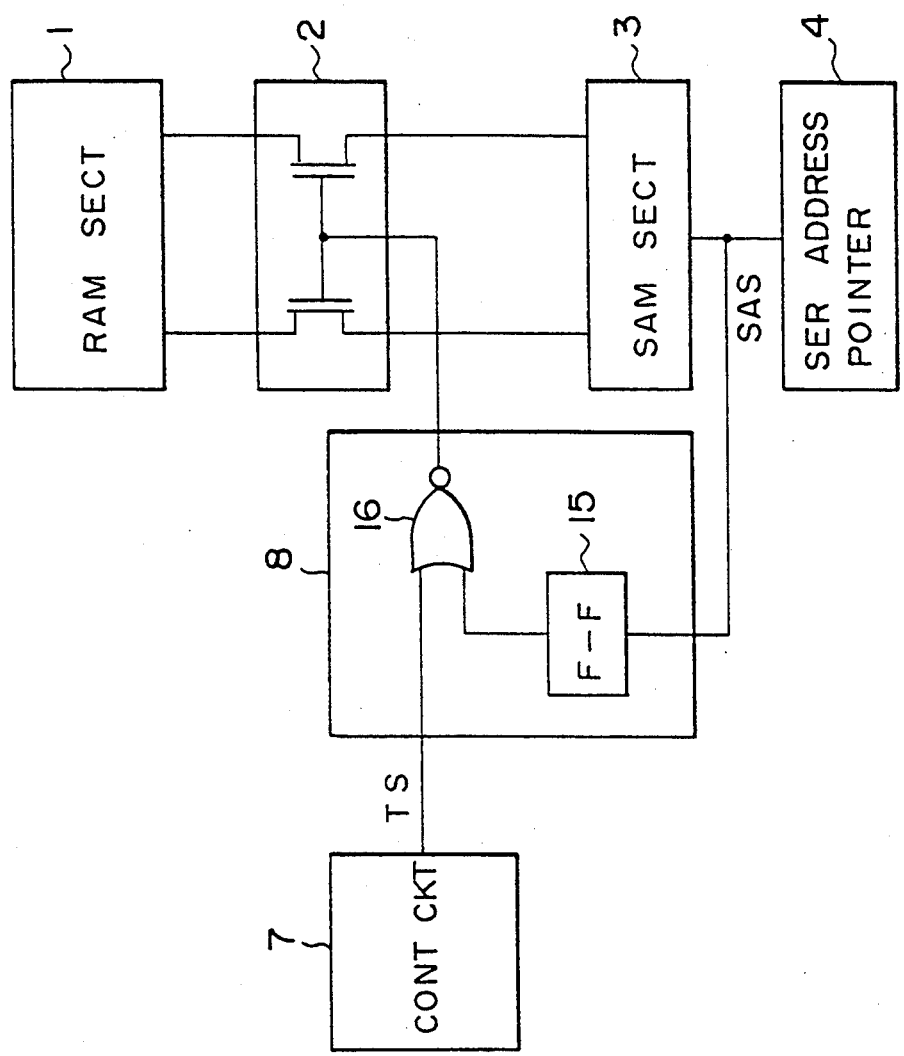
FIG. 2 is a block diagram showing a selecting circuit shown in FIG. 1.

FIG. 2 is a block diagram showing the selecting circuit 8 for one bit. In FIG. 2, the transfer signal TS is given from the control circuit 7 to the transfer gate 2 through a NOR circuit 16 of the selecting circuit 8. An output of a flip-flop circuit 15 is applied to the other input terminal of the NOR circuit 16. This flip-flop circuit 15 stores the serial address signal SAS applied from the serial address pointer 4. Further, the outputs of the SAM section 3 are given to the RAM section 1 through the transfer gate 2.

The operation of the selecting circuit 8 constructed as described above will be described hereinbelow.

When the transfer signal TS is at a high level, the output of the NOR circuit 16 is at a low level, so that the transfer gate 2 is turned off.

Under these conditions, when the transfer signal TS changes to the low level, if the output of the flip-flop circuit 15 is at the high level, since the output of the NOR circuit 16 is at the low level, the transfer gate 2 is kept turned off. If the output of the flip-flop circuit 15 is at the low level, since the output of the NOR circuit 16 is at the high level, the transfer gate 2 is turned on, so that data of the SAM section 3 are transferred to the RAM section 1.

Here, in FIG. 1, the flip-flop circuit 15 shown in FIG. 2 is provided for each bit of the SAM section 3. When the external input data ED are stored in the SAM section 3 on the basis of the external clock SC, this flip-flop circuit 15 operates as follows. When the serial address signal SAS rises, the flip-flop circuit 15 is set to indicate that data in this bit area is to be rewritten, so that the low level signal is transmitted from the flip-flop circuit 15 to the NOR circuit 16. In other words, when data in partial areas of the SAM section 3 are required to be rewritten, the flip-flop circuits 15 of the corresponding bits are all set in the selecting circuits 8, respectively. Therefore, the flip-flop circuits 15 corresponding to the bits with respect to which no data are acquired in the SAM section 3 are kept reset in the selecting circuits 8, respectively.

Thereafter, when the transfer signal TS is inputted from the control circuit 7, a turn-on signal is transmitted to only the transfer gates 2 of bits corresponding to the flip-flop circuits 15 now being set. Accordingly, only data in the corresponding areas in the SAM section 3 are transferred to the RAM section 1 for a data rewriting operation.

Further, in the above-mentioned embodiment, the area in which data is to be rewritten in the SAM section 3 is discriminated on the basis of the set or reset status of the flip-flop circuit 15 of the selecting circuit 8. Without being limited thereto, the same effect can be obtained by setting a flag for the bit with respect to which data has been rewritten. In this case, the transfer gate 2 is controlled on the basis of the status of the flag, respectively.

Further, in the above-mentioned embodiment, it is also possible to reset the flip-flop circuit 15 on the basis of the succeeding data writing operation to the SAM section 3; on the basis of the transfer signal TS itself after data has been transferred in response to the transfer signal TS; or by transmitting a reset signal from another circuit so as to delay the timing at which the succeeding serial signal is inputted to the SAM section 3.

On the other hand, it is possible to switch the partial write transfer operation to the whole write transfer operation or vice versa on the basis of the status of the control signal outputted under the condition that a row address signal RAS is not outputted. For instance, it is possible to execute the switching operation by forcibly suppressing a column address signal CAS following the RAS in the current write transfer operation.

Further, in the above-mentioned embodiment, a set-reset type flip-flop circuit is shown as the flip-flop circuit 15 by way of example. However, the same effect can be obtained by use of a D-type flip-flop. In this case, data can be set in response to an external clock SC. In any cases, any well-known circuits can be used, as far as the area in which data of the SAM section 3 has been rewritten can be stored and further the transfer signal TS to be given to the transfer gate 2 can be controlled.

As described above, in the embodiment of the present invention, it is possible to selectively transfer only the data rewritten in the SAM section 3 to the RAM section 1. Therefore, any superfluous operation cycles for partial rewriting are not necessary, so that data of the RAM section 1 can be rewritten at a high speed. Since the data rewriting unit is not fixed as is conventional, data can be rewritten freely and further any start address can be selected. In other words, it is possible to rewrite only necessary data freely, with the result that the high speed function of the SAM section 3 (as compared with that of the RAM section 1) can be utilized sufficiently, thus enabling a high speed access to the memory device. In addition, when the memory device according to the present invention is applied to the memory device for a display unit, since only the data in the areas required to be rewritten on the display image are retrieved and then rewritten, the software configuration for the display unit can be simplified, and thereby it is possible to realize a high response speed display function.

As described above, in the dual port DRAM provided with both RAM section and the SAM section according to the present invention, since only partial data of the RAM section can be rewritten at high speed, the superfluous operation cycles required for data rewriting operation so far required can be eliminated, and thereby it is possible to realize a high access speed dual port DRAM.

What is claimed is:

1. A partial write transferrable multiport memory, comprising:
   a RAM section for storing data composed of a plurality of bits and for inputting and outputting said data at random from and to an outside source;
   a SAM section for storing data composed of a plurality of bits and for inputting and outputting said data in series from and to said outside source, said data being transferrable in parallel to and from said RAM section, and each bit of said data being stored in one of a plurality of registers in said SAM section in accordance with a serial address signal input to said SAM section, wherein said serial address signal indicates a range of said registers to be used to store each of said plurality of bits of said data in one of said inputting and outputting data operation;
   a transfer gate section connected between said RAM section and said SAM section and having a plurality of transfer gates, each of said transfer gates corresponding on a one-to-one basis to each of said registers of said SAM section, wherein, when said transfer gates are turned on, said data in said registers of said SAM section are transferred between said RAM section and said SAM section; and
   selecting means for selectively turning on a plurality of turn-on signals for each of said transfer gates, wherein each of said turn-on signals is applied on a one-to-one basis to a corresponding one of said transfer gates to turn said corresponding one of said transfer gates on, said turn-on signals formed by a logical result of only transfer signal and said serial address signal to turn on only said transfer gates corresponding to said data input to said registers of said SAM section from said outside source, so that only said data to be rewritten to said RAM section are transferred from said SAM section to said RAM section so as to partially rewrite said data in said RAM section.

2. The partial write transferrable multiport memory of claim 1, wherein said selecting means comprises a plurality of selecting circuits, each of said selecting circuits corresponding to each of said transfer gates.

3. The partial write transferrable multiport memory of claim 2, wherein each of said selecting circuits comprises storing means for storing a result as to whether a corresponding bit of said SAM section has been rewritten or not, corresponding one of said transfer gates being turned on or off on the basis of an output of said storing means.

4. The partial write transferrable multiport memory of claim 3, wherein bit data to be rewritten in said SAM section are determined on the basis of a serial address signal obtained by decoding an address signal with a serial address decoder.

5. The partial write transferrable multiport memory of claim 4, wherein the serial address signal is stored in a serial address pointer, an output of said serial address pointer rewriting data of said storing means of each of said selecting circuits and further rewriting a bit of said SAM section.

6. The partial write transferrable multiport memory of claim 3, wherein each of said selecting circuits turns on or off each of said transfer gates on the basis of a logical result of an output of said storing means and a signal corresponding to a control signal applied externally.

7. The partial write transferrable multiport memory of claim 4, wherein each of said selecting circuits turns on or off each of said transfer gates on the basis of a logical result of an output of said storing means and a signal corresponding to a control signal applied externally.

8. The partial write transferrable multiport memory of claim 5, wherein each of said selecting circuits turns on or off each of said transfer gates on the basis of a logical result of an output of said storing means and a signal corresponding to a control signal applied externally.

9. The partial write transferrable multiport memory of claim 6, wherein a row address of bits with respect to which parallel data are transferred from said SAM section to said RAM section is determined on the basis of a signal obtained by decoding an address signal with an address decoder.

10. The partial write transferrable multiport memory of claim 7, wherein a row address of bits with respect to which parallel data are transferred from said SAM section to said RAM section is determined on the basis of a signal obtained by decoding an address signal with an address decoder.

11. The partial write transferrable multiport memory of claim 8, wherein a row address of bits with respect to which parallel data are transferred from said SAM section to said RAM section is determined on the basis of a signal obtained by decoding an address signal with an address decoder.

12. The partial write transferrable multiport memory of claim 9, wherein said address decoder is driven on the basis of a signal corresponding to the control signal.

13. The partial write transferrable multiport memory of claim 10, wherein said address decoder is driven on the basis of a signal corresponding to the control signal.

14. The partial write transferrable multiport memory of claim 11, wherein said address decoder is driven on the basis of a signal corresponding to the control signal.

15. The partial write transferrable multiport memory of claim 4, wherein said serial address decoder executes said parallel data transfer in synchronism with an external clock signal applied from an outside source.

16. The partial write transferrable multiport memory of claim 5, wherein said serial address decoder executes said parallel data transfer in synchronism with an external clock signal applied from an outside source.

17. The partial write transferrable multiport memory of claim 7, wherein said serial address decoder executes said parallel data transfer in synchronism with an external clock signal applied from an outside source.

18. The partial write transferrable multiport memory of claim 8, wherein said serial address decoder executes the parallel data transfer in synchronism with an external clock signal applied from the outside.

19. The partial write transferrable multiport memory of claim 3, wherein said storing means is a flip-flop.

20. The partial write transferrable multiport memory of claim 4, wherein said storing means is a flip-flop.

21. The partial write transferrable multiport memory of claim 5, wherein said storing means is a flip-flop.

* * * * *